(12) United States Patent
Kamijo

(10) Patent No.: US 6,489,620 B1
(45) Date of Patent: Dec. 3, 2002

(54) ASTIGMATISM-CORRECTION DEVICE AND CHARGED-PARTICLE-BEAM MICROLITHOGRAPHY APPARATUS AND METHODS COMPRISING SAME

(75) Inventor: Koichi Kamijo, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/575,215

(22) Filed: May 18, 2000

(51) Int. Cl.$^7$ ................................................. H01J 37/00
(52) U.S. Cl. ........................... 250/396 ML; 250/492.22
(58) Field of Search ...................... 250/396 ML, 396 R, 250/398, 492.22, 492.2

(56) References Cited

U.S. PATENT DOCUMENTS 6,432,594 B1 * 8/2002 Kamijo .................... 250/492.2

* cited by examiner

Primary Examiner—Kiet T. Nguyen
(74) Attorney, Agent, or Firm—Klarquist Sparkman LLP

(57) ABSTRACT

Astigmatism-correction devices are disclosed for use in a charged-particle-beam (CPB) microlithography apparatus and methods and that do not produce higher-order aberrations when correcting deflection aberrations. The CPB microlithography apparatus includes a projection-optical system that includes first and second projection lenses and associated deflectors. The astigmatism-correction device can include a first coil array associated with the first projection lens upstream of an aperture, and a second astigmatism-correction device associated with the second projection lens downstream of the aperture. In each coil array, the nominal half-angle of the constituent coils is 30°. With such a configuration, higher-order aberrations that otherwise would be produced by the deflectors are reduced nearly to zero, making it possible to use large electrical currents in the deflectors. Specifically, deflection-astigmatism aberrations and hybrid deflection-astigmatic distortions otherwise produced by the deflectors are eliminated.

7 Claims, 4 Drawing Sheets

ASTIGMATISM-CORRECTION DEVICE AND CHARGED-PARTICLE-BEAM MICROLITHOGRAPHY APPARATUS AND METHODS COMPRISING SAME

FIELD OF THE INVENTION

This invention pertains to microlithography (projection-exposure) of a pattern, defined by a reticle, onto a suitable substrate. Microlithography is a key technology used in the manufacture of semiconductor integrated circuits and displays. More specifically, the invention pertains to microlithography performed using a charged particle beam (e.g., electron beam) as an energy beam. Yet more specifically, the invention pertains to apparatus and methods for reducing astigmatism (e.g., deflection astigmatism, hybrid deflection astigmatic distortion, and the like) in charged-particle-beam (CPB) microlithography apparatus.

BACKGROUND OF THE INVENTION

As the sizes of circuit elements in integrated circuits have continued to be further miniaturized, the limitations of optical microlithography (i.e., microlithography performed using light such as ultraviolet light) have become apparent. This has led to much research directed to the development of practical microlithography apparatus and methods that employ an energy beam other than light. Considerable research effort has been directed to microlithography apparatus and methods that employ a charged particle beam such as an electron beam or ion beam.

Various approaches to charged-particle-beam (CPB) microlithography have been investigated. Three approaches include (1) spot-beam exposure, (2) variable-shaped beam exposure, and (3) block exposure. Each of these approaches can provide superior resolution to optical microlithography. However, each provides much lower throughput (number of wafers that can be processed per unit time) than optical microlithography. Specifically, approaches (1) and (2) have limited throughput because they perform exposure by tracing a pattern element-by-element using a beam having an extremely small spot diameter or a square profile. Block exposure (approach (3)) was developed to improve throughput over that of approaches (1) and (2) by utilizing a reticle on which the pattern elements have standard shapes that are exposed in batches. However, batch exposure currently does not provide a sufficiently high throughput because the number of pattern elements that can be defined on the reticle is limited, and because batch exposure typically must be performed in conjunction with the variable-shaped beam approach.

In order to improve throughput, so-called "divided-reticle" CPB microlithography has been proposed. In divided-reticle CPB microlithography, the pattern as defined on the reticle is divided or segmented into multiple exposure units usually termed "subfields" that are individually exposed by respective shots in an ordered manner. Such a reticle is termed a "divided" or "segmented" reticle. During exposure, the images of the individual subfields are positioned contiguously on the substrate (wafer) to form the image of the entire die.

Certain aspects of this divided exposure are shown in FIG. 4. The wafer is typically exposed with multiple "dies" or "chips." Each die is comprised of multiple rows of subfields that are arranged in "stripes." Each die is exposed stripe-by-stripe and (within each stripe) subfield-by-subfield. The reticle defining the pattern to be exposed onto each die is similarly divided.

For projection exposure, the subfields of the reticle are sequentially irradiated ("illuminated") in an ordered manner by a charged particle beam (e.g., electron beam or ion beam). Upstream of the reticle, the beam (termed an "illumination beam") passes through an "illumination-optical system." Downstream of the reticle, the beam (termed a "patterned beam," formed by passage of the illumination beam through the irradiated subfield) passes through a "projection-optical system." Each of the illumination-optical system and the projection-optical system comprises multiple lenses.

Certain aspects of exposure are shown in FIG. 5, which shows a stripe as defined on the reticle and a corresponding stripe as formed on the wafer. The reticle is mounted on a reticle stage (not shown), and the wafer stage is mounted on a wafer stage (not shown). During exposure of a stripe, the reticle stage and wafer stage are moved synchronously at respective constant velocities along the center line of the stripe. (The respective velocities of stage movement are established and controlled according to the demagnification ratio of the projection-optical system.) The subfields in the stripe on the reticle are illuminated sequentially, row by row, by the illumination beam. To illuminate each row, the illumination beam is deflected in a direction roughly perpendicular to the direction of travel of the reticle stage to sequentially illuminate the individual subfields in the row. After all the subfields in a row are exposed, exposure proceeds to the next row. Hence, exposure is performed in a raster manner. To maximize throughput, exposure of each row is performed by deflecting the beam in opposite directions, as shown in FIG. 5. When exposure of a stripe is completed, the reticle stage and wafer stage are stopped and then shifted horizontally to the next stripe.

Throughput is remarkably improved with the divided-reticle technique, as shown in FIGS. 4 and 5, because each subfield is exposed in a single respective "shot," and all the elements of a pattern to be transferred are defined on the reticle.

On a divided reticle, each subfield is separate from adjacent subfields. Extending between the subfields are "struts" that provide substantial mechanical rigidity and strength to the reticle. The struts also allow individual subfields to be accurately selected for illumination by the illumination beam.

More complex or larger patterns require more subfields and hence more stripes. Increasing the number of stripes requires a corresponding increase in the number of times that the reticle stage and the wafer stage must be moved back and forth to expose each die. This results in a corresponding increase in the number of times that the stages must be accelerated and decelerated. During accelerations and decelerations of the stages, exposure cannot be performed and the time is wasted. To avoid losses in throughput, the width of each stripe is increased (i.e., each row of subfields has more subfields) to reduce the number of stripes. Such increases in stripe width require corresponding increases in the width of the deflection field of the illumination beam.

The lenses in the illumination-and projection-optical systems, similar to their counterparts in conventional optical systems, can exhibit any of various aberrations corresponding to respective aberrations exhibited by optical lenses. With an increase in stripe width, the distance over which the beam must be deflected laterally is correspondingly increased. i.e., the beam must pass through more off-axis portions of the lenses in the illumination- and projection-optical systems, which results in greater deflection aberrations.

A "hybrid deflection-astigmatic distortion" refers to an astigmatic distortion (aberration) having a magnitude proportional both to lateral deflection distance and the beam size (the lateral dimensions of the subfield). This and related aberrations result in a blurred (defocused) and distorted image as exposed onto the wafer. To correct aberrations, one or more deflectors are conventionally provided in the illumination- and/or projection-optical systems. Image defocusing and/or distortion can be ameliorated somewhat by adjusting the excitation current applied to such a deflector so as to alter the beam trajectory in a manner that reduces aberrations. However, these remedies alone are no longer sufficient to achieve the desired resolution in CPB microlithography.

A conventional approach to providing better correction of deflection-astigmatism aberrations and hybrid deflection-astigmatism distortions involves the use of an astigmatism-correction device. In such a device, a magnetic field is produced that is proportional to $\cos[2\theta]$ in a magnetic-field distribution in a cylindrical coordinate system $(z,r,\theta)$, wherein the optical axis is the z-axis and $\theta$ is the rotational angle around the optical axis. Conventionally, higher-order components produced by the astigmatism-correction device, i.e., magnetic-field components proportional to $\cos[6\theta]$, were considered relatively small and negligible. However, with increased aberrations in CPB microlithography apparatus in which the lateral beam deflection is increased to accommodate wider stripes, the drive current applied to the astigmatism-correction device also is increased. This situation generated problems in that magnetic-field components proportional to $\cos[6\theta]$ produced by the astigmatism-correction device could no longer be neglected.

SUMMARY OF THE INVENTION

The problems summarized above are addressed by the present invention, wherein an object of the invention is to provide astigmatism-correction devices that do not produce higher-order aberrations when correcting substantial deflection aberrations. Another object is to provide charged-particle-beam (CPB) microlithography apparatus that include such astigmatism-correction devices.

One embodiment of an astigmatism-correction device is used in conjunction with a CPB microlithography apparatus comprising a projection-optical system through which a charged particle beam passes from a reticle to a substrate. The astigmatism-correction device comprises a coil array situated in the projection-optical system such that the charged particle beam passes through the coil array. The coil array exhibits a nominal half-angle of approximately 30° so as to eliminate deflection astigmatism and hybrid deflection-astigmatic distortion of an image produced on the substrate by the charged particle beam.

The coil array can comprise eight coils arranged radially about an optical axis of the projection-optical system. One of the coils desirably is orientated at a nominal half-angle, relative to the optical axis, of $\psi$. In such a configuration, the other coils have nominal half-angles of $(-\psi)$, $(\pi/2-\psi)$, $(\pi/2+\psi)$, $(\pi-\psi)$, $(\pi+\psi)$, $(3\pi/2-\psi)$, and $(3\pi/2+\psi)$. Each coil may be toroidal, saddle, compound saddle, or other suitable configuration.

The projection-optical system typically includes first and second projection lenses arranged along an optical axis, and an aperture situated on the optical axis between the first and second projection lenses. In such a situation, the astigmatism-correction device desirably comprises a first coil array situated upstream of the aperture within and coaxial with the first projection lens, and a second coil array situated downstream of the aperture within and coaxial with the second projection lens.

The projection-optical system also can include a first array of multiple deflectors arranged along the optical axis within the first projection lens, and a second array of multiple deflectors arranged along the optical axis within the second projection lens. The first array can comprise eight deflectors, and the second array can comprise four deflectors. Again, the astigmatism-correction device can comprise a first coil array situated upstream of the aperture within and coaxial with the first projection lens, and a second coil array situated downstream of the aperture within and coaxial with the second projection lens.

According to another aspect of the invention, CPB microlithography apparatus are provided that comprise the astigmatism-correction device summarized above. In such an apparatus, the higher-order $6\theta$ component of the magnetic field is virtually no problem, even if high currents are applied to deflectors of the apparatus. Hence, stripe width can be increased according to the resulting increase in lateral deflection of the charged particle beam, which allows improved throughput.

The foregoing and additional features and advantages of the invention will be more readily understood from the following detailed description, which proceeds with reference to the accompanying drawings.

DETAILED DESCRIPTION

Figure 1:
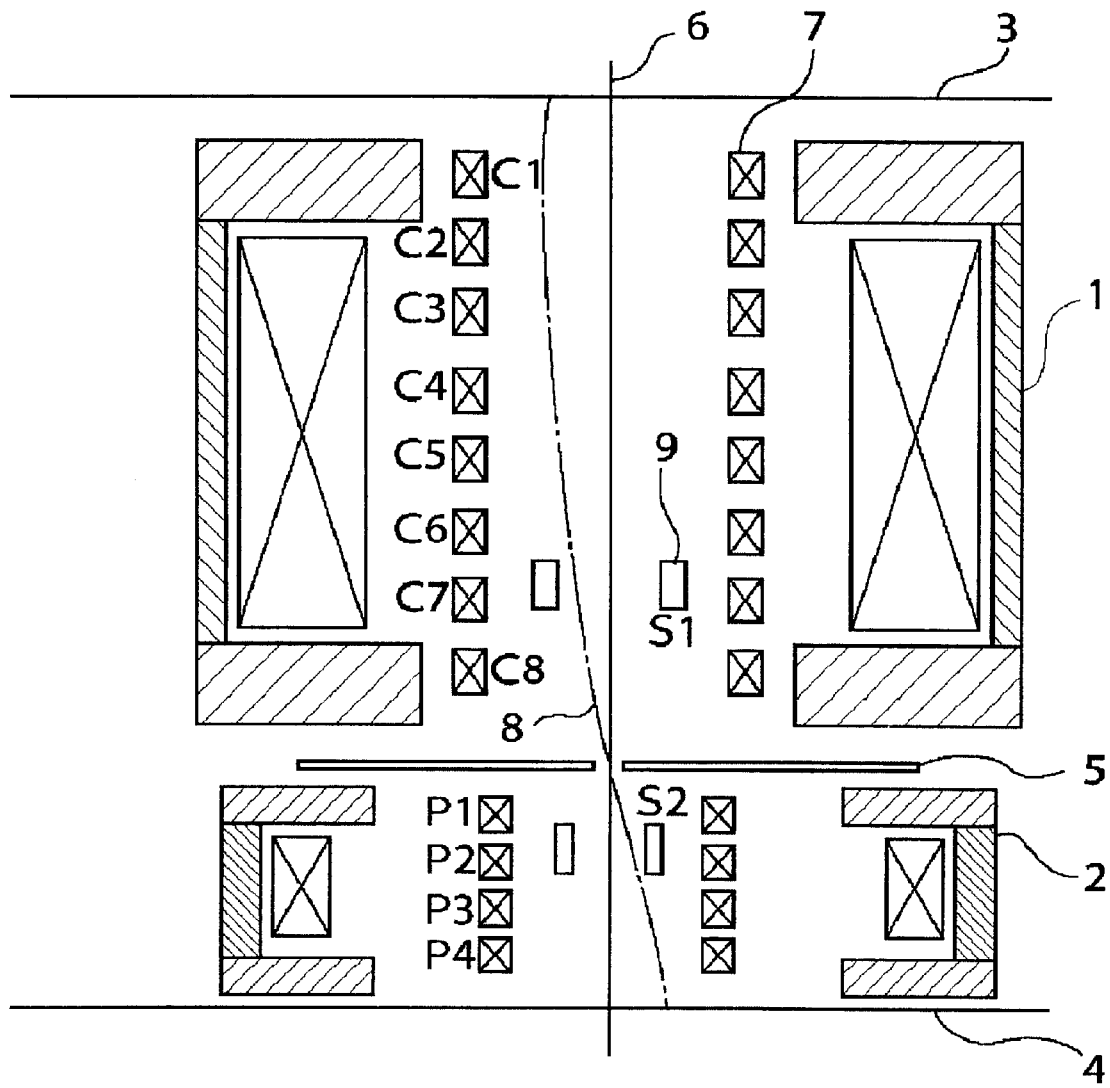
FIG. 1 is an elevational section of a projection-optical system, for a charged-particle-beam (CPB) microlithography apparatus, including a representative embodiment of an astigmatism-correction device according to the invention.

A representative embodiment of a projection-optical system, according to the invention, for a charged-particle-beam (CPB) microlithography apparatus is shown in FIG. 1. The projection-optical system comprises a first projection lens 1 and a second projection lens 2 situated along an optical axis 6. The projection lenses 1, 2 are situated between a reticle 3 and a substrate ("wafer") 4. Between the projection lenses 1, 2 is an aperture 5. A deflector array 7 extends axially through the first and second projection lenses 1 and 2. The trajectory 8 is a representative trajectory of the patterned beam, and item 9 is an astigmatism-correction device.

The reticle 3 is irradiated by an illumination-optical system (not shown) situated upstream of the reticle 3. The portion of the illumination beam passing through the irradiated region on the reticle 3 is the patterned beam that passes through the projection lenses 1, 2, which form an image on the wafer 4. The aperture located between the projection lenses 1, 2 blocks charged particles of the patterned beam that were scattered by passing through the reticle 3.

The deflector array 7 includes, in this embodiment, eight individual deflectors C1–C8 upstream of the aperture 5 (in association with the first projection lens 1), and four individual deflectors P1–P4 downstream of the aperture 5 (in association with the second projection lens 2). The deflectors C1–C8 and P1–P4 serve, in part, to deflect the patterned beam appropriately to propagate along a predetermined trajectory 8 such that the beam passes through the aperture 5 and forms an image at a predetermined position on the wafer 4. The deflectors also eliminate distortion and aberrations in the image.

An astigmatism-correction device 9 desirably has a first coil array disposed upstream of the aperture 5 (at location S1) and a second coil array disposed downstream of the aperture 5 (at location S2). The astigmatism-correction device 9 eliminates deflection-astigmatism aberrations and hybrid deflection-astigmatic distortions produced by lateral deflection of the beam.

Each coil array desirably has eight coils arranged radially relative to the optical axis 6. One of the coils desirably is orientated at a nominal half-angle, relative to the optical axis, of ψ. In such a configuration, the other coils have nominal half-angles of $(-\psi)$, $(\pi/2-\psi)$, $(\pi/2+\psi)$, $(\pi-\psi)$, $(\pi+\psi)$, $(3\pi/2-\psi)$, and $(3\pi/2+\psi)$. Each coil may be toroidal, saddle, compound saddle, or other suitable configuration.

The 6θ component of the magnetic field is proportional to $\sin[6\psi]$, wherein the nominal half-angle of a coil of the correction device is ψ. Since $\sin[6\times30°]=\sin[180°]=0$, the 6θ component of the magnetic field becomes essentially zero. As used herein, "approximately 30°" means that, whereas the 6θ component of the magnetic field can be brought completely to zero, as explained above, if the half-angle is precisely 30°, the half-angle does not have to be precisely 30°. Rather, the half-angle can vary slightly from 30° according to the tolerance range for the 6θ component of the magnetic field. The extent of the acceptable variation can be determined easily by a person of ordinary skill in the art armed with knowledge of an acceptable tolerance range for the 6θ component of the magnetic field.

In an example of this embodiment, the axial distance between the reticle 3 and the wafer 4 is 600 mm. The respective excitation currents applied to the projection lenses 1, 2 are predetermined to achieve a demagnification ratio of 1/4 and a subfield size, as projected on the wafer 4, of 0.25 mm square.

As described below, the performance of the astigmatism-correction device 9 can be evaluated by evaluating the magnitude of higher-order aberrations produced when eliminating a 402-nm deflection astigmatism and a 93-nm hybrid deflection-astigmatic distortion produced when projecting an irradiated region on the reticle 3 to a position on the surface of the wafer 4 laterally situated 2.5 mm from the optical axis 6, using a beam having a 6-mrad aperture angle.

Figure 3:
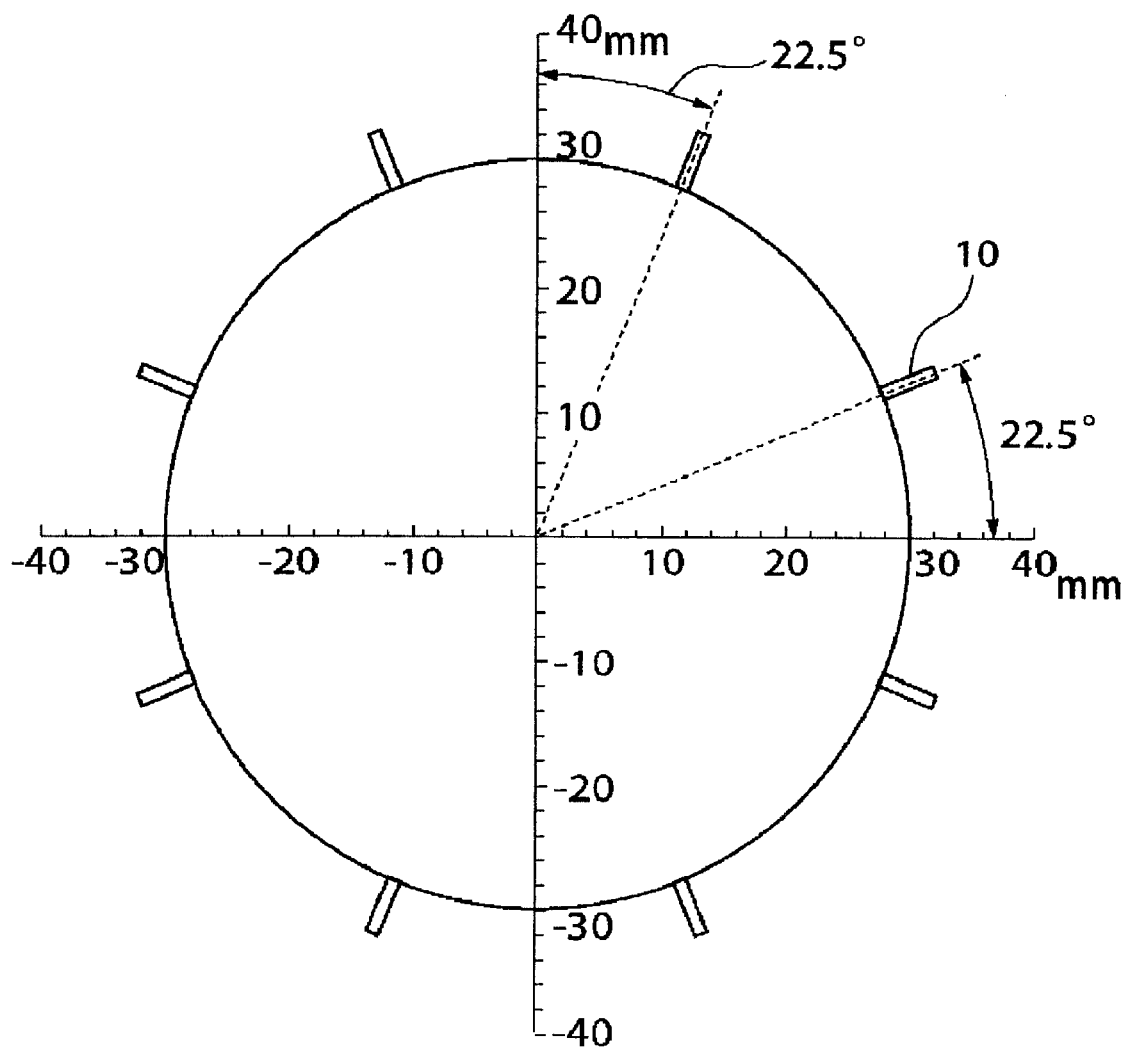
FIG. 3 is a plan-view profile of a toroidal coil array as used in the comparison example.
Figure 4:
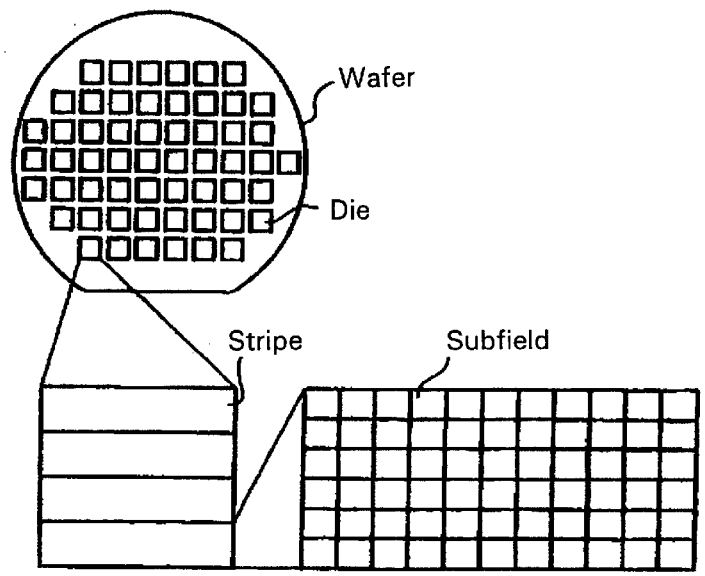
FIG. 4 depicts certain aspects of conventional divided-reticle projection-exposure.
Figure 5:
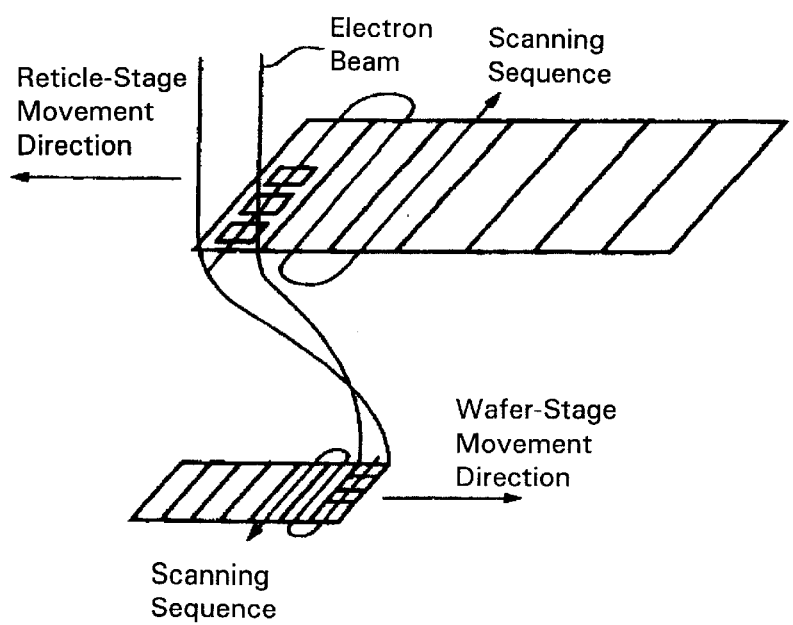
FIG. 5 shows further aspects of conventional divided-reticle projection-exposure.

First, as a comparative example, an astigmatism-correction device 9 was evaluated having a nominal half-angle of 22.5° and that produces a 6θ component in the magnetic field. The astigmatism-correction device comprised a first coil array at the position S1, and a second coil array at the position S2. Each coil array comprised, as shown in FIG. 3, eight coils 10. The angle between the x-axis and each of four of the coils is 22.5°. The angle between the y-axis and each of the remaining four coils is also 22.5°. The dimensions of the coil array at the position S1 are 20-mm coil length along the optical axis, 30-mm inside diameter, and 35-mm outside diameter. The dimensions of the coil array at the position S2 are 20-mm coil length along the optical axis, 16-mm inside diameter, and 20-mm outside diameter. The center of the coil array at the position S1 is 300 mm along the optical axis from the reticle 3, and the center of the coil array at the position S2 is 500 mm along the optical axis from the reticle 3.

Figure 2:
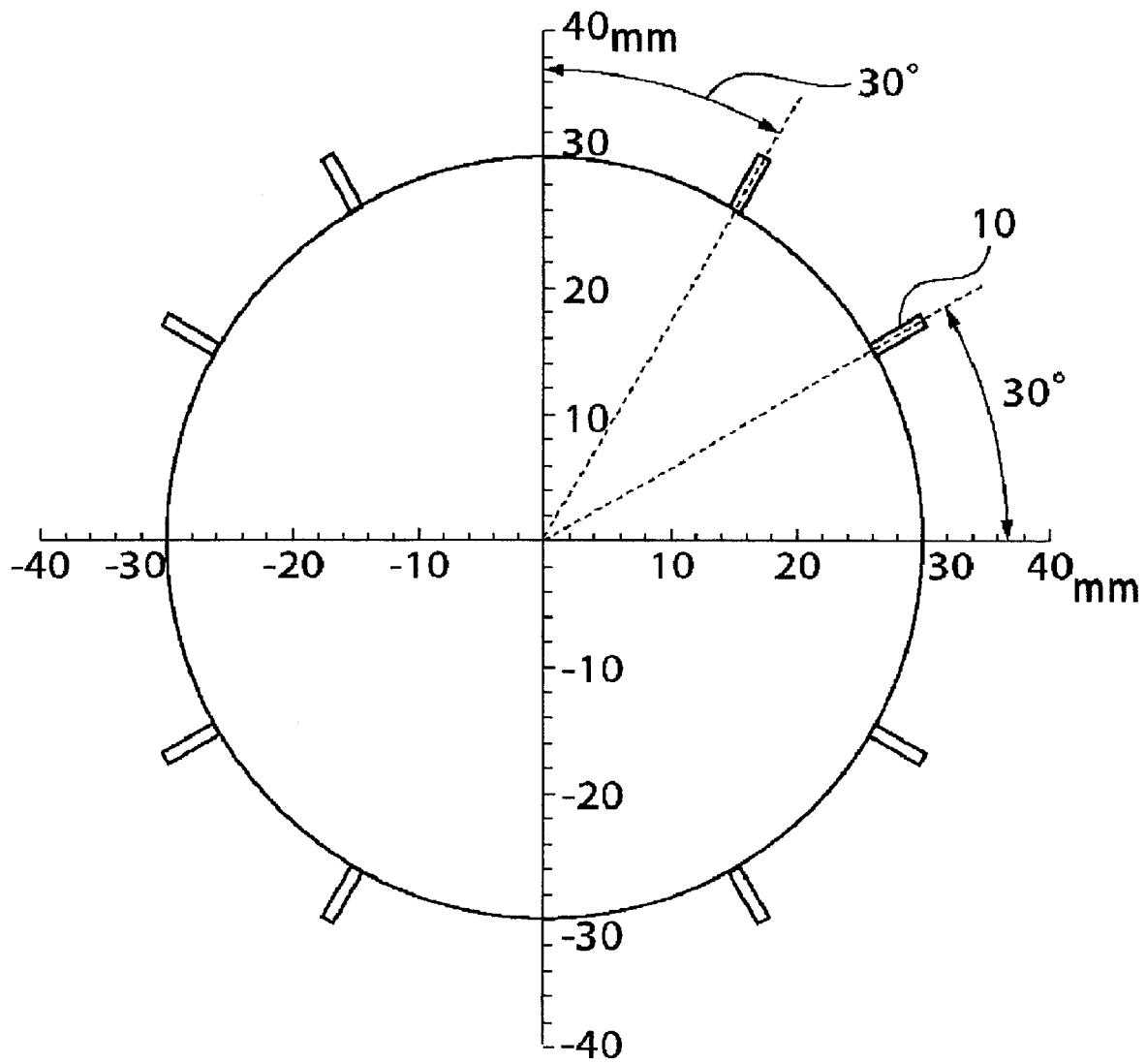
FIG. 2 is a plan-view profile of a toroidal coil array as used in an astigmatism-correction device according to the representative embodiment.

In an example, as shown in FIG. 2, an astigmatism-correction device was evaluated having a nominal half-angle of 30° and that did not produce a 6θ component in the magnetic field. The astigmatism-correction device comprised a first coil array at the position S1, and a second coil array at the position S2. Each coil array comprised, as shown in FIG. 3, eight coils 10. The angle between the x-axis and each of four of the coils is 30°. The angle between the y-axis and each of the remaining four coils is also 30°. The dimensions of the coil array at the position S1, the dimensions of the coil array at the position S2, and the respective axial positions of the coil arrays are the same as respective dimensions in the comparative example.

The coil shapes and higher-order aberrations (6θ components) in the example and in the comparison example are shown in Table 1.

TABLE 1

| | | Comparison Example | Example Embod. |
|---|---|---|---|
| Coil Array at S1 | Length along optical axis (mm) | 20 | 20 |
| | Inside diameter (mm) | 30 | 30 |
| | Outside diameter (mm) | 35 | 35 |
| | Position (mm) | 300 | 300 |
| Coil Array at S2 | Length along optical axis (mm) | 20 | 20 |
| | Inside diameter (mm) | 16 | 16 |
| | Outside diameter (mm) | 20 | 20 |
| | Position (mm) | 500 | 500 |
| Angle | (degrees) | 22.5 | 30 |
| Higher Order Aberrations | Blur (nm) | 9.1 | 0.0 |
| | Distortion (nm) | 6.3 | 0.0 |

In the comparison example, a blur of 9.1 nm and a distortion of 6.3 nm (that could not be eliminated) were produced because the angle configuration of the astigmatism-correction device was not appropriate to eliminate the 6θ component. In contrast, in the example in which the angle configuration was appropriate to eliminate the 6θ component, higher-order aberrations were 0 nm.

Hence, the example, exemplifying an astigmatism-correction device according to the invention, essentially eliminates the 6θ component (i.e., the higher-order component of the magnetic field). As a result, aberrations otherwise produced by that component are reduced nearly to zero. Also, the lateral distance over which the beam can be deflected can be increased by applying a larger current to the beam-deflection deflector, thereby allowing the stripe width to be increased and throughput to be increased.

Whereas the invention has been described in connection with a representative embodiment, it will be understood that the invention is not limited to that embodiment. On the contrary, the invention is intended to encompass all modifications, alternatives, and equivalents as may be included within the spirit and scope of the invention, as defined by the appended claims.

What is claimed is:

1. In a charged-particle-beam microlithography apparatus comprising a projection-optical system through which a charged particle beam passes from a reticle to a substrate, an astigmatism-correction device, the device comprising a coil array situated in the projection-optical system such that the charged particle beam passes through the coil array, the coil array exhibiting a nominal half-angle of approximately 30° so as to eliminate deflection astigmatism and hybrid deflection-astigmatic distortion of an image produced on the substrate by the charged particle beam.

2. The device of claim 1, wherein the coil array comprises eight coils arranged radially about an optical axis of the projection-optical system.

3. The device of claim 1, wherein:
   the projection-optical system includes first and second projection lenses arranged along an optical axis, and an aperture situated on the optical axis between the first and second projection lenses; and
   the astigmatism-correction device comprises a first coil array situated upstream of the aperture within and coaxial with the first projection lens, and a second coil array situated downstream of the aperture within and coaxial with the second projection lens.

4. The device of claim 1, wherein:
   the projection-optical system includes first and second projection lenses arranged along an optical axis, an aperture situated on the optical axis between the first and second projection lenses, a first array of multiple deflectors arranged along the optical axis within the first projection lens, and a second array of multiple deflectors arranged along the optical axis within the second projection lens; and
   the astigmatism-correction device comprises a first coil array situated upstream of the aperture within and coaxial with the first projection lens, and a second coil array situated downstream of the aperture within and coaxial with the second projection lens.

5. The device of claim 4, wherein the first array comprises eight deflectors, and the second array comprises four deflectors.

6. A charged-particle-beam microlithography apparatus, comprising the astigmatism-correction device of claim 1.

7. A method for manufacturing a semiconductor device, comprising a microlithographic step performed using the apparatus of claim 6.

* * * * *

UNITED STATES PATENT AND TRADEMARK OFFICE
CERTIFICATE OF CORRECTION

PATENT NO. : 6,489,620 B1
DATED : December 3, 2002
INVENTOR(S) : Kamijo

It is certified that error appears in the above-identified patent and that said Letters Patent is hereby corrected as shown below:

<u>Title page,</u>
Item [30], please insert the following:
-- [30] Foreign Application Priority Data
May 18, 1999 [JP] Japan ……….. 11-136902 --

Signed and Sealed this

Eighth Day of June, 2004

JON W. DUDAS
*Acting Director of the United States Patent and Trademark Office*